US010971546B2

(12) United States Patent
Carta et al.

(10) Patent No.: US 10,971,546 B2
(45) Date of Patent: Apr. 6, 2021

(54) CROSSPOINT PHASE CHANGE MEMORY WITH CRYSTALLIZED SILICON DIODE ACCESS DEVICE

(71) Applicant: International Business Machines Corporation, Armonk, NY (US)

(72) Inventors: Fabio Carta, Pleasantville, NY (US); Matthew J. BrightSky, Armonk, NY (US); Bahman Hekmatshoartabari, White Plains, NY (US); Asit Ray, Baldwin Place, NY (US); Wanki Kim, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/542,929

(22) Filed: Aug. 16, 2019

(65) Prior Publication Data
US 2021/0050384 A1 Feb. 18, 2021

(51) Int. Cl.
*H01L 27/24* (2006.01)
*H01L 21/3213* (2006.01)
(Continued)

(52) U.S. Cl.
CPC ...... *H01L 27/2409* (2013.01); *H01L 21/0262* (2013.01); *H01L 21/02532* (2013.01); *H01L 21/02573* (2013.01); *H01L 21/02631* (2013.01); *H01L 21/02675* (2013.01); *H01L 21/30604* (2013.01); *H01L 21/32133* (2013.01);
(Continued)

(58) Field of Classification Search
CPC .......... H01L 27/2409; H01L 21/02532; H01L 45/1233; H01L 21/32133; H01L 45/1675; H01L 29/16; H01L 21/0262; H01L 29/6609; H01L 45/06; H01L 21/02675; H01L 21/02631; H01L 21/30604; H01L 21/02573; H01L 29/8615; H01L 27/2463; H01L 29/04
See application file for complete search history.

(56) References Cited

U.S. PATENT DOCUMENTS 7,285,464 B2 10/2007 Herner et al.
7,888,711 B2 2/2011 Cheung et al.
(Continued)

*Primary Examiner* — Matthew L Reames
(74) *Attorney, Agent, or Firm* — L. Jeffrey Kelly, Esq.; Hoffmann & Baron, LLP

(57) ABSTRACT

A method of fabricating an access device in a crosspoint memory array structure during BEOL processing includes: forming at least a first doped semiconductor layer on an upper surface of a first conductive layer, the first doped semiconductor layer being in electrical connection with the first conductive layer; exposing at least a portion of the first doped semiconductor layer to a directed energy source to cause localized annealing in the first doped semiconductor layer to activate a dopant of a first conductivity type in the first doped semiconductor layer, thereby converting at least a portion of the first doped semiconductor layer into a polycrystalline layer; forming a second conductive layer over a least a portion of the first doped semiconductor layer; and etching the first doped semiconductor layer and the first and second conductive layers to form an access device that is self-aligned with the first and second conductive layers.

20 Claims, 11 Drawing Sheets

(51) Int. Cl.
    *H01L 45/00*           (2006.01)
    *H01L 29/04*           (2006.01)
    *H01L 29/16*           (2006.01)
    *H01L 29/861*         (2006.01)
    *H01L 29/66*           (2006.01)
    *H01L 21/02*           (2006.01)
    *H01L 21/306*         (2006.01)

(52) U.S. Cl.
    CPC .......... *H01L 27/2463* (2013.01); *H01L 29/04* (2013.01); *H01L 29/16* (2013.01); *H01L 29/6609* (2013.01); *H01L 29/8615* (2013.01); *H01L 45/06* (2013.01); *H01L 45/1233* (2013.01); *H01L 45/1675* (2013.01)

(56) References Cited

U.S. PATENT DOCUMENTS

| | | |
|---|---|---|
| 8,030,634 B2 | 10/2011 | Lung et al. |
| 8,115,258 B2 | 2/2012 | Shim |
| 8,405,062 B2 | 3/2013 | Yin et al. |
| 8,664,689 B2 | 3/2014 | Lung et al. |
| 9,793,474 B2 | 10/2017 | Sun et al. |
| 2006/0034116 A1 | 2/2006 | Lam et al. |
| 2007/0133250 A1 | 6/2007 | Kim |
| 2009/0189137 A1* | 7/2009 | Kinoshita ........... H01L 21/8221 257/2 |
| 2009/0294751 A1* | 12/2009 | Kiyotoshi ........... H01L 27/2409 257/4 |
| 2011/0305064 A1* | 12/2011 | Jo ...................... G11C 13/0002 365/148 |
| 2013/0044532 A1 | 2/2013 | Bethune et al. |

\* cited by examiner

CROSSPOINT PHASE CHANGE MEMORY WITH CRYSTALLIZED SILICON DIODE ACCESS DEVICE

BACKGROUND

The present invention relates generally to the electrical, electronic and computer arts, and, more particularly, to memory devices and methods of forming such devices.

In a crosspoint array, memory cells are sandwiched between perpendicular wordlines (WLs) and bitlines (BLs). The maximal ideal density of a two-dimensional memory array is generally achieved with a $4F^2$ crosspoint array, where F is the minimum resolvable feature size, with a memory cell residing at each unique intersection of perpendicular wiring lines in the memory array. Moreover, the memory cells are fabricated in a back end of line (BEOL) process, which enables peripheral circuits to be hidden underneath the crosspoint array. Using a multilayer (e.g., three-dimensional) structure could further reduce the effective cell area, however the absence of access transistors in a crosspoint array complicates write and read operations.

Crosspoint memory arrays generally require non-linear elements serving as access devices to block leakage from other lines (e.g., wordlines and bitlines). Ovonic threshold switches (OTSs) are presently being proposed for use as access devices for stackable 3D memory applications. However, arsenic (As) and selenium (Se) materials which are commonly employed to produce ovonic threshold switches are generally incompatible with standard fabrication processing techniques, and arsenic and selenium are considered toxic and therefore pose a serious risk to human health (see, e.g., Agency for Toxic Substances and Disease Registry (ATSDR)). Furthermore, these ovonic threshold devices are difficult to pattern, are sensitive to reactive ion etching (RIE) and are often damaged during the patterning step, which results in reduced yield. The sharp turn-on voltage of an OTS device inhibits its use in a multilevel memory cell architecture.

Silicon diodes have been proposed for use as an alternative access device. A silicon diode typically consists of a junction formed by doping two different parts of a same semiconductor material with opposite conductivity types, one P-doped and one N-doped, thereby forming an active P-N junction. The dopants are usually implanted using a high-energy beam (e.g., ion implantation) and then require high temperature processing (e.g., rapid thermal anneal (RTA)), generally at about 900 degrees Celsius, to activate the dopants (by partially substituting silicon atoms with the dopant atoms in the crystal lattice). However, this implantation and high temperature processing step has a significant time overhead associated therewith, and furthermore during RTA, the elevated temperature required by the dopant activation is not compatible with 3D integration in the BEOL.

SUMMARY

Aspects according to embodiments of the present invention provide a crosspoint memory structure and fabrication method that advantageously integrates, in the back end of line (BEOL), a vertical diode as an access device with a processing temperature below about 400 degrees Celsius (° C.), to thereby avoid damaging active device junctions which may formed during front end of line (FEOL) processing. In one or more embodiments, fabrication of the vertical diodes is preferably achieved using sputter deposition of doped and/or intrinsic silicon (e.g., by physical vapor deposition (PVD)), rather than by doped implantation (e.g., ion implantation). This process retains a sharp, box-shape dopant profile and has the added benefit that processing can be accomplished by cluster fabrication (e.g., cluster tools), whereby a wafer is directly placed into a laser chamber for laser annealing and crystallization into polysilicon, thus providing a FEOL- and BEOL-compatible means for integrating a polysilicon vertical diode into a crosspoint memory array.

In accordance with an embodiment of the invention, a method of fabricating an access device in a crosspoint memory array structure during BEOL processing includes: forming at least a first doped semiconductor layer on an upper surface of a first conductive layer, the first doped semiconductor layer being in electrical connection with the first conductive layer; exposing at least a portion of the first doped semiconductor layer to a directed energy source to cause localized annealing in the first doped semiconductor layer for activating a dopant of a first conductivity type in the first doped semiconductor layer, thereby converting at least a portion of the first doped semiconductor layer into a polycrystalline layer; forming a second conductive layer over a least a portion of the first doped semiconductor layer; and etching the first doped semiconductor layer and the first and second conductive layers to form an access device that is self-aligned with the first and second conductive layers.

In accordance with another embodiment of the invention, a method of fabricating a memory cell for use in a crosspoint memory array includes forming an access device during BEOL processing of the crosspoint memory array, wherein forming the access device comprises: forming at least a first doped semiconductor layer on an upper surface of a first conductive layer, the first doped semiconductor layer being in electrical connection with the first conductive layer; exposing at least a portion of the first doped semiconductor layer to a directed energy source, the directed energy source causing localized annealing in the first doped semiconductor layer to activate a dopant of a first conductivity type in the first doped semiconductor layer, thereby converting at least a portion of the first doped semiconductor layer into a polycrystalline layer; forming a second conductive layer over a least a portion of the first doped semiconductor layer; and etching the first doped semiconductor layer and the first and second conductive layers to form an access device that is self-aligned with the first and second conductive layers. The method further includes forming a storage element on at least a portion of the access device and in electrical connection with the access device, the storage element being self-aligned with the access device.

Techniques as disclosed herein can provide substantial beneficial technical effects. By way of example only and without limitation, one or more embodiments may provide one or more of the following advantages:

- provides a fast throughput integration scheme wherein a stack of oppositely doped films are deposited in situ without requiring an extra implant step;
- provides a way to integrate a vertical diode into a crosspoint memory array in the BEOL, without a need for elevated temperature processing (e.g., over 400° C.);
- eliminates the need for OTSs and the risks associated with using toxic materials, such as arsenic or selenium;
- compatible with BEOL wafer processing.

These and other features and advantages will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

Figure 1A:
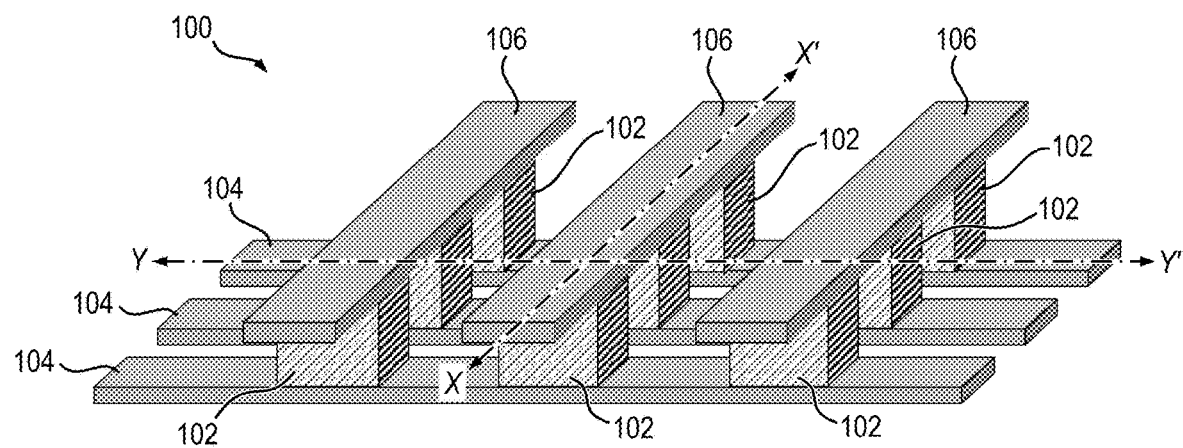
FIGS. 1A and 1B are perspective views conceptually depicting at least a portion of an illustrative crosspoint memory array having a single-layer and multiple-layer (i.e., stacked) arrangement of memory cells, respectively, in accordance with embodiments of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative crosspoint memory structures and methods for fabricating such memory structures. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the present disclosure.

It is to be appreciated that the various layers, regions and/or components shown in the accompanying figures may not be drawn to scale. Furthermore, one or more semiconductor layers of a type commonly used in such integrated circuit structures may not be explicitly shown in a given figure for economy of description. This does not imply, however, that the semiconductor layer(s) not explicitly shown are omitted in the actual integrated circuit structure.

As previously stated, memory cells in a crosspoint memory array are typically fabricated in a BEOL process, which beneficially allows peripheral circuits (memory controller, etc.) to be placed underneath the crosspoint array to conserve valuable die space. Using a multilayer (e.g., stacked) structure further increases storage density in the device, however fabrication of access transistors in the crosspoint memory array, which function to block leakage from other lines (e.g., word lines and bit lines), has heretofore been difficult to achieve.

Aspects according to embodiments of the invention provide a crosspoint memory structure and fabrication method that advantageously integrates, in the BEOL, a vertical diode access device that can be formed with a processing temperature below about 400° C., to thereby avoid damaging active device junctions which may be formed during FEOL processing. In one or more embodiments, fabrication of the vertical diodes is preferably achieved using sputter deposition of doped and/or intrinsic silicon (e.g., by physical vapor deposition (PVD)), rather than by doped implantation (e.g., ion implantation). The dopant is then activated using a localized annealing process, such as with an excimer laser or other directed energy source, which does not expose the entire wafer to elevated temperatures. This process retains a sharp, box-shape dopant profile and has the added benefit that processing can be accomplished by cluster fabrication (e.g., cluster tools), whereby a wafer is directly placed into a laser chamber for laser annealing and crystallization into polysilicon, thus providing a FEOL- and BEOL-compatible means for integrating a polysilicon vertical diode into a crosspoint memory array.

Figure 1B:
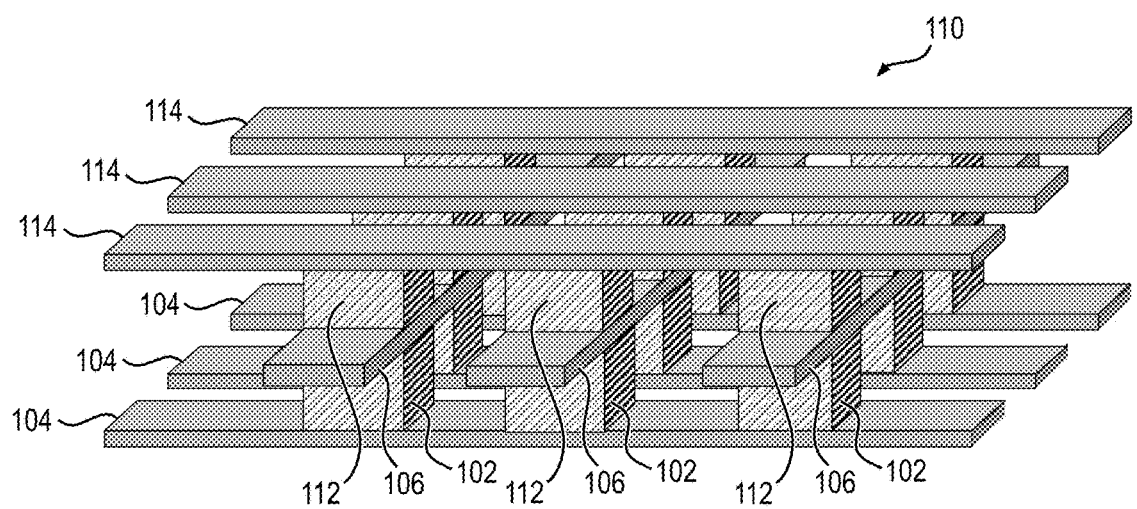

FIGS. 1A and 1B are perspective views conceptually depicting at least a portion of an illustrative crosspoint memory array having a single-layer and multilayer (i.e., stacked) arrangement of memory cells, respectively, in accordance with embodiments of the invention. With reference to FIG. 1A, a single-layer crosspoint memory array 100 includes a plurality of memory cells 102 disposed at intersections of row (e.g., word) lines 104 and column (e.g., bit) lines 106. The row lines 104 are preferably substantially orthogonal to the column lines 106 in the crosspoint memory array 100, and the memory cells 102 are preferably formed in a self-aligned fabrication process. A memory controller (not explicitly shown), for example, may select a particular memory cell 102 in the array for a read, write and/or erase operation by applying appropriate signals on a unique pair of row and column lines intersecting at the selected memory cell.

In one or more embodiments, wiring levels in the memory array structure are self-aligned with the memory cells 102; a lower wiring level (e.g., row line 104) is patterned in conjunction with the patterning of a bottom electrode of the memory cell 102 and an upper wiring level (e.g., column line 106) is patterned in conjunction with the patterning of a top electrode of the memory cell. Multiple layers of the crosspoint memory array structure can be combined (e.g., stacked) to form a three-dimensional (3D) memory architecture.

More particularly, in order to increase storage density, a crosspoint memory array may employ a multilayer (i.e., stacked or 3D) architecture, as shown in FIG. 1B. Specifically, with reference to FIG. 1B, an exemplary stacked crosspoint memory array 110 includes a first plurality of memory cells 102 disposed at an intersection of a first wiring level, forming a first plurality of row lines 104, and a second wiring level, forming a first plurality of column lines 106, as described above in conjunction with FIG. 1A. The stacked crosspoint memory array 110 further includes a second plurality of memory cells 112 disposed at intersections of the first plurality of column lines 106 and a third wiring level, forming a second plurality of row lines 114. In one or more embodiments, each of the second plurality of memory cells 112 is preferably disposed above and aligned with a corresponding one of the first plurality of the memory cells 102.

In this exemplary stacked crosspoint memory array 110, vertically adjacent levels of memory cells share common column lines 106. If a third plurality of memory cells (not explicitly shown) is formed above the second plurality of memory cells 112, the second and third pluralities of memory cells would share common row lines 114 in a similar manner, as will become apparent to those skilled in the art. Each plurality of row and column lines is formed in a different plane of metal during a BEOL metallization process. For example, the first plurality of row lines 104 may be formed using M4 (metal layer 4) metal, the first plurality of column lines 106 may be formed using M5 (metal layer 5) metal, the second plurality of row lines 114 may be formed using M6 (metal layer 6) metal, and so on.

It is to be appreciated that each of the memory cells 102, 112, although not explicitly shown (but implied), preferably comprises a storage (i.e., memory) region and an integrated switch region electrically connected in series with the memory region. In one or more embodiments, the switch region may be electrically connected and adjacent to a corresponding column line (e.g., 106) while the memory region may be electrically connected and adjacent to a corresponding row line (e.g., 104). In one or more alternative embodiments, the switch region may be electrically connected and adjacent to a corresponding row line (e.g., 104 or 114) while the memory region may be electrically connected and adjacent to a corresponding column line (e.g., 106). The switch regions of the memory cells 102, 112 may be controlled by a memory controller, or the like, configured to supply suitable signals to a selected memory cell for providing a low impedance path to a corresponding memory region in the selected memory cell to thereby access the memory region of the selected memory cell. Conversely, when not selected, the switch regions of the memory cells are preferably configured to present a high impedance path so as to electrically isolate the corresponding memory regions from the row and column lines and thereby prevent leakage in the crosspoint memory array.

Figure 2A:
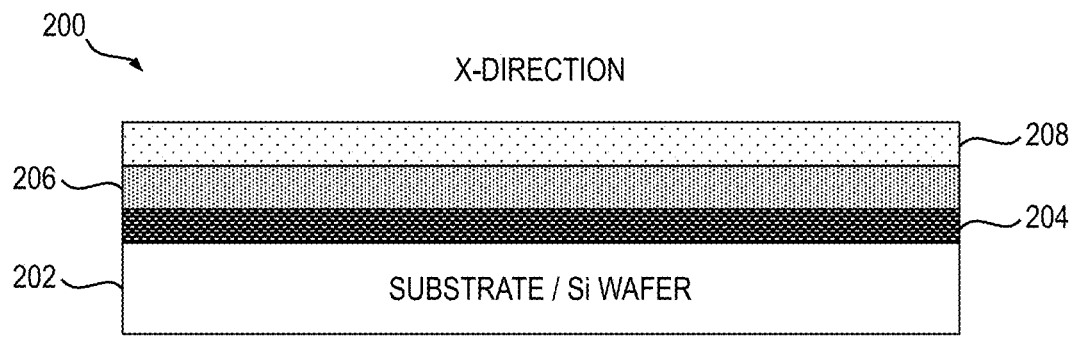
FIGS. 2A and 2B are cross-sectional views depicting a first intermediate step in an exemplary method of fabricating a stackable single-layer crosspoint memory array structure 200 is shown, according to an embodiment of the present invention.
Figure 2B:
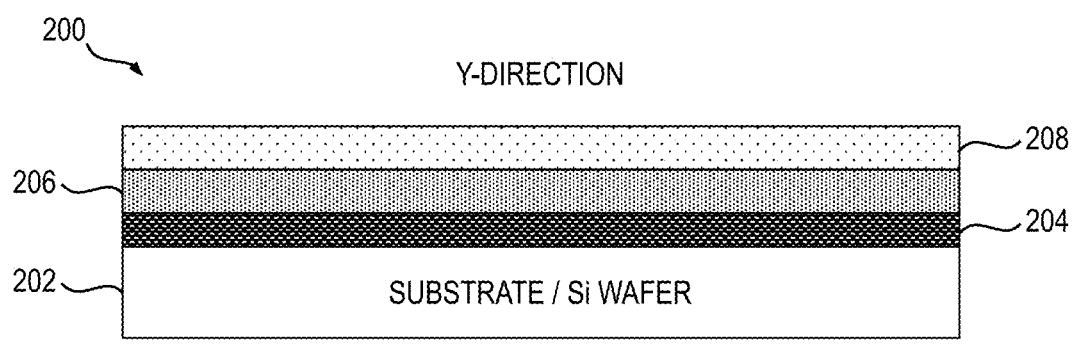

By way of example only and without limitation, an illustrative process flow for fabricating a stackable single-layer crosspoint memory array structure 200 will be described in conjunction with FIGS. 2A-2B, 3A-3B, 4A-4B, 5A-5B, 6A-6B, 7A-7B, 8A-8B, 9A-9B, 10A-10B, 11A-11B, and 12A-12B, according to one or more embodiments of the invention. With reference to FIGS. 2A-2B, cross-sectional views of a first intermediate step in an exemplary method of fabricating the stackable single-layer crosspoint memory array structure 200 are shown, according to an embodiment of the invention; FIG. 2A is a cross-sectional view of the memory array structure in a first direction (along line X-X' in FIG. 1A), and FIG. 2B is a cross-sectional view of the memory array structure in a second direction (along line Y-Y' in FIG. 1A), orthogonal to the first direction.

The crosspoint memory array structure 200 includes a semiconductor substrate 202, which may be a silicon (Si) wafer, in which circuit elements or other structures may be formed during FEOL and partial BEOL processing of the wafer. In FIGS. 2A-2B, a first wiring layer (e.g., M4) 204, which may be used to form first row lines (e.g., 104 in FIG. 1A), is formed on the substrate 202 after FEOL and partial BEOL processing in situ with other processing layers used to form the memory cells in the memory array structure 200. The first wiring layer 204 is preferably blanket deposited in situ and will be patterned together with other memory cells layers in a subsequent processing step, as will be described in further detail below in conjunction with FIG. 5A. In one or more embodiments, the first wiring layer 204 comprises a metal, such as, for example, tungsten, aluminium, titanium (Ti)/titanium nitride (TiN), or tantalum nitride (TaN), although embodiments of the invention are not limited to any specific material for the first wiring layer.

A first amorphous doped silicon layer 206 of a first conductivity type, which may be P-type in one or more embodiments, is preferably formed on at least a portion of an upper surface of the first wiring layer 204. It is to be appreciated that although layer 206 is referred to herein as a doped silicon layer, other semiconductor materials may be similarly used, such as, but not limited to, silicon germanium (SiGe). The doped silicon layer 206, in one or more embodiments, is blanket deposited in situ, such as by physical vapor deposition (PVD) sputtering from a doped silicon target. A thickness of the PVD-deposited doped silicon layer 206 is preferably about 50-150 nanometers (nm), although embodiments of the invention are not limited to any specific thickness. Alternative embodiments of the invention contemplate the use of a doped implant process, rather than PVD, for forming the first doped silicon layer 206.

It is to be appreciated that plasma-enhanced chemical vapor deposition (PECVD) may also be used to deposit the doped silicon layer 206, but this approach can introduce undesirable amounts of hydrogen which require a higher temperature (e.g., 500° C. to 650° C.) to drive away the hydrogen. PECVD-deposited films with high hydrogen content cannot be used in a laser crystallization process, as the fast release of hydrogen during the laser irradiation will lead to film ablation. On the other hand, high temperature dehydrogenation steps risk damaging PN junctions formed during FEOL wafer processing. Deposition of doped silicon using PVD, rather than implanting dopants into an undoped silicon layer (e.g., using ion implantation or the like), provides a sharp, box-like pre-activation dopant profile.

Optionally, in one or more embodiments, an intrinsic silicon (i-Si) layer 208 is formed on at least a portion of an upper surface of the doped silicon layer 206. The intrinsic silicon layer 208 may be used, for example, in forming PIN diodes, which generally include an undoped intrinsic semiconductor (e.g., silicon) region sandwiched between doped semiconductor regions of opposite conductivity types (e.g., P- and N-doped silicon regions). In the context of forming PIN diodes, the doped silicon layer 206 and intrinsic silicon layer 208, in one or more embodiments, are preferably deposited in situ by PVD sputtering from doped and intrinsic silicon targets, respectively, either by sputtering each layer separately from a single target or through co-sputtering.

Next, silicon crystallization is performed to convert the amorphous doped silicon layer 206 into a polycrystalline silicon layer. The intrinsic silicon layer 208, which is preferably deposited after the doped silicon layer 206, is also converted to polycrystalline silicon but in a separate annealing process, in one or more embodiments, usually at a lower energy level compared to the crystallization process used to convert layer 206 so as to avoid dopant intermixing. However, rather than exposing the entire wafer to a high-temperature annealing process, which would essentially destroy the PN junctions formed during FEOL processing, localized heating sufficient to convert the amorphous silicon into polycrystalline silicon is performed, in one or more embodiments, using a directed energy source, preferably excimer laser crystallization (or excimer laser annealing (ELA)), although it is to be understood that any BEOL-compatible method may be employed (e.g., solid-state laser). Subsequently, a planarization process is performed, such as, for example, chemical-mechanical planarization/polishing (CMP) or the like, to planarize an upper surface of the wafer.

Figure 3A:
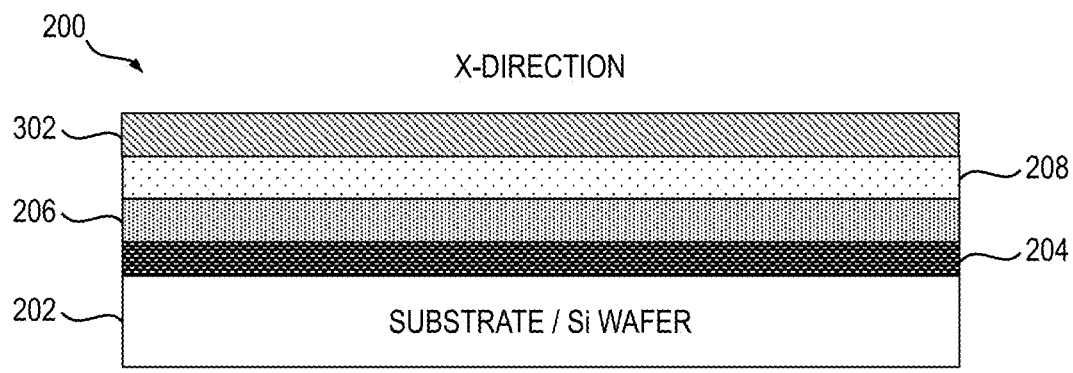
FIGS. 3A-3B are cross-sectional views depicting a second intermediate step in the exemplary method of fabricating the stackable single-layer crosspoint memory array structure, according to an embodiment of the present invention.
Figure 3B:
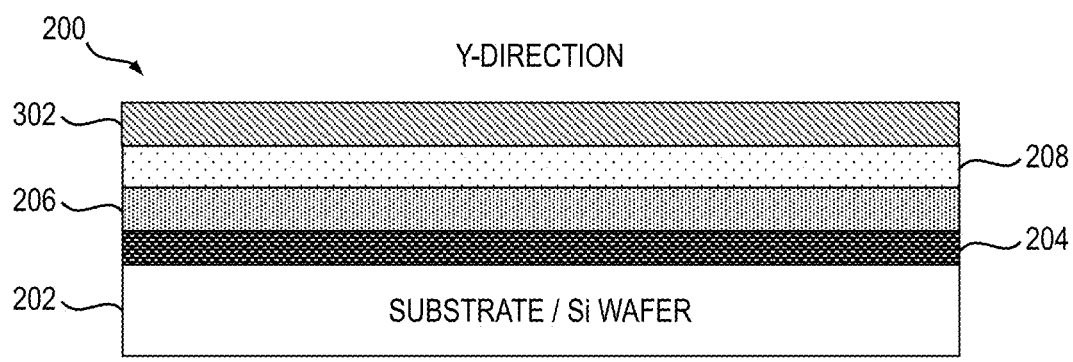

FIGS. 3A-3B are cross-sectional views depicting a second intermediate step in the exemplary method of fabricating the stackable single-layer crosspoint memory array structure 200, according to an embodiment of the invention; FIG. 3A is a cross-sectional view of the memory array structure in the first direction (along line X-X' in FIG. 1A), and FIG. 3B is a cross-sectional view of the memory array structure in the second direction (along line Y-Y' in FIG. 1A), orthogonal to the first direction. As shown in FIGS. 3A-3B, a second amorphous doped silicon layer 302 of a second conductivity type, opposite the first conductivity type used to form the first doped silicon layer 206, is preferably formed on at least a portion of an upper surface of the intrinsic silicon layer 208, if used, or alternatively the upper surface of the first doped silicon layer 206. In one or more embodiments, the second doped silicon layer 302 is of N-type conductivity. Although the second doped layer 302 is referred to herein as a doped silicon layer, it is to be appreciated that other semiconductor materials may be similarly employed, such as, for example, SiGe.

Like the first doped silicon layer 206, the second doped silicon layer 302, in one or more embodiments, is preferably deposited in situ by PVD sputtering from a doped silicon target. A thickness of the PVD-deposited doped silicon layer 302 is preferably about 50-150 nanometers (nm), although embodiments of the invention are not limited to any specific thickness. Deposition of doped silicon using PVD, rather than implanting dopants into an undoped silicon layer (e.g., using ion implantation or the like), provides a sharp, box-like pre-activation dopant profile. However, alternative embodiments of the invention still contemplate the use of a doped implant process, rather than PVD, for forming the doped silicon layer 302.

Next, silicon crystallization is performed to convert the amorphous doped silicon layer 302 into a polycrystalline silicon layer in a manner consistent with the silicon crystallization process performed on the first doped silicon layer 206. The amorphous doped silicon layer 302 is annealed together with the intrinsic silicon layer 208, in one or more embodiments. As previously stated, in one or more embodiments this second silicon crystallization process used to anneal layers 302 and 208 is preferably performed at a lower energy level compared to the first silicon crystallization process used to convert the first doped silicon layer 206 to polycrystalline silicon primarily to prevent dopant intermixing.

Again, rather than exposing the entire wafer to a high-temperature annealing process, localized annealing using a directed energy source, preferably excimer laser crystallization or ELA, is used to convert the amorphous silicon into polycrystalline silicon, in one or more embodiments. It is to be understood, however, that any BEOL-compatible method may be employed for performing silicon crystallization. Subsequently, a planarization process is performed, such as, for example, CMP or the like, to planarize an upper surface of the wafer.

Figure 4A:
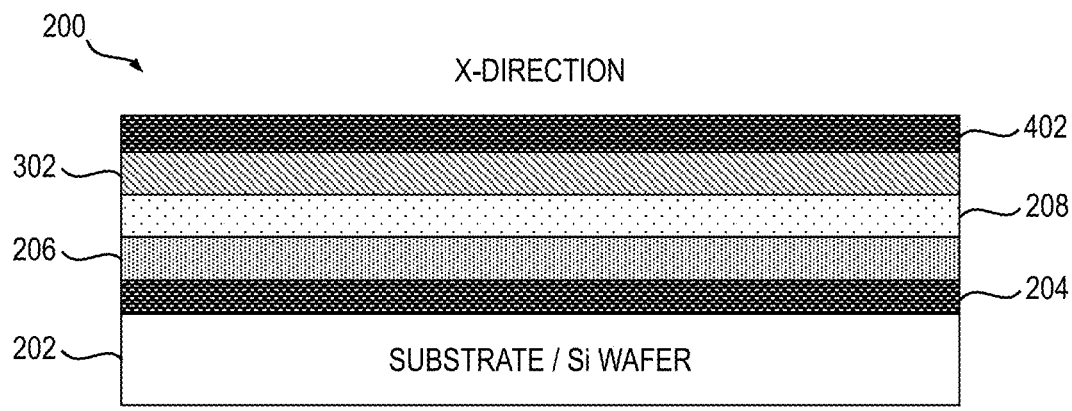
FIGS. 4A-4B are cross-sectional views depicting a third intermediate step in the exemplary method of fabricating the stackable single-layer crosspoint memory array structure, according to an embodiment of the present invention.
Figure 4B:
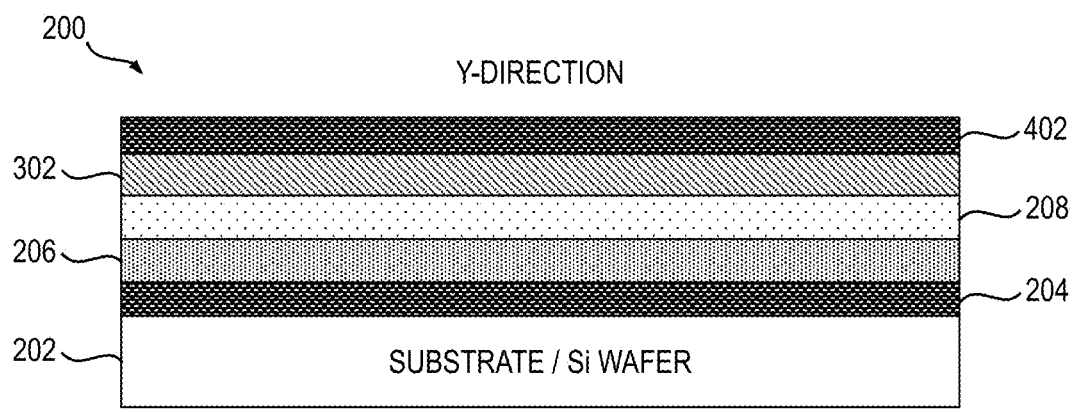

FIGS. 4A-4B are cross-sectional views depicting a third intermediate step in the exemplary method of fabricating the stackable single-layer crosspoint memory array structure 200, according to an embodiment of the invention; FIG. 4A is a cross-sectional view of the memory array structure in the first direction (along line X-X' in FIG. 1A), and FIG. 4B is a cross-sectional view of the memory array structure in the second direction (along line Y-Y' in FIG. 1A), orthogonal to the first direction. As shown in FIGS. 4A-4B, a second wiring layer (e.g., M5) 402, which may be used to form first column lines (e.g., 106 in FIG. 1A), is formed on at least a portion of an upper surface of the second doped silicon layer 302. In one or more embodiments, the second wiring layer 402 comprises a metal, such as, for example, tungsten or aluminium, although embodiments of the invention are not limited to any specific material for the second wiring layer. Although not explicitly shown, other optional layers may also be formed on the second wiring layer 402, in one or more embodiments of the invention, including layers used to facilitate the fabrication process, such as, for example, one or more buffer layers to allow switching of reactive ion etching (RIE) chemistries, and/or one or more layers adapted to improve adhesion and workfunction of the PCM cell.

Figure 5A:
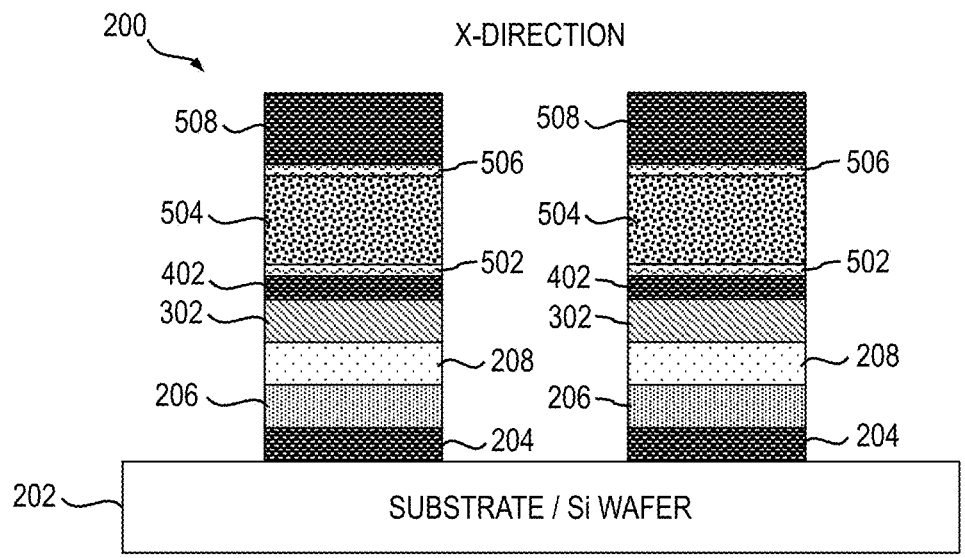
FIGS. 5A-5B are cross-sectional views depicting an exemplary patterning and etching process for forming a first set of lines (e.g., row or column lines) and memory region of the memory cells in the stackable single-layer crosspoint memory array structure, according to an embodiment of the present invention.
Figure 5B:
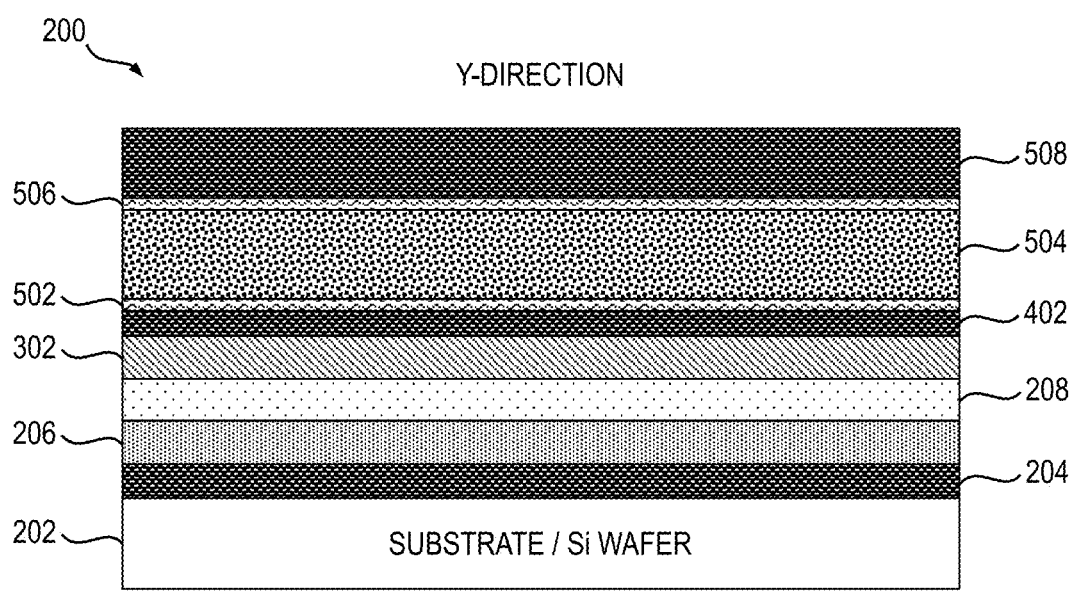

With reference now to FIGS. 5A-5B, an exemplary patterning and etching process is depicted for forming a first set of lines (e.g., row or column lines) and memory region of the memory cells in the stackable single-layer crosspoint memory array structure 200, according to an embodiment of the invention; FIG. 5A is a cross-sectional view of the memory array structure in the first direction (along line X-X' in FIG. 1A), and FIG. 5B is a cross-sectional view of the memory array structure in the second direction (along line Y-Y' in FIG. 1A), orthogonal to the first direction. During patterning, a photoresist layer is deposited over the surface of the wafer, such as, for example, by spin coating or the like. The wafer is then exposed as part of a photolithographic process, using a mask to form a pattern of intense light, to transfer the desired mask pattern onto the wafer. The resulting pattern, which is generally referred to as a hard mask, serves to protect select portions of the wafer during subsequent etching. During etching, a liquid ("wet") or plasma ("dry") chemical agent removes the uppermost layer of the substrate in areas that are not protected by the patterned hard mask. Dry etching techniques are generally used, since they can be made anisotropic, thereby avoiding significant undercutting of the hard mask pattern.

FIGS. 5A-5B depict at least a portion of the exemplary memory array structure 200, showing the deposition of memory region materials in forming the memory cells in the memory array structure. Specifically, a first conductive layer 502 is formed on at least a portion of an upper surface of the second wiring layer 402. A layer of phase change material (PCM) 504 is then formed on at least a portion of an upper surface of the first conductive layer 502. A second conductive layer 506 is formed on at least a portion of an upper surface of the PCM layer 504. A top electrode 508 is then formed on at least a portion of an upper surface of the second conductive layer 506 for electrically accessing the PCM memory region. The top electrode 508 is preferably of sufficient cross-sectional thickness to be used as a hard mask for subsequent processing. After patterning the first line, all top electrodes are electrically connected together through a layer of metal (e.g., 702 shown in FIG. 7), as will be described in further detail herein below. FIG. 5A depicts at least a portion of the exemplary memory array structure 200, viewed in the x-direction (i.e., along line X-X' in FIG. 1A), showing the resulting stack structure after etching.

The first and second conductive layers 502, 506, which surround the PCM layer 504 in a sandwich-like manner, may comprise, for example, metal nitride (e.g., (e.g., tantalum nitride (TaN), titanium nitride (TiN), WN) or another suitable conductive material. The PCM layer 504, in one or more embodiments, preferably comprises GeSbTe (germanium-antimony-tellurium or GST) but can be any phase change material, as will be known to those skilled in the art.

Optionally, in one or more embodiments, a liner and spacer may be formed after PCM patterning prior to etching the metal and remaining stack structure to mitigate resistance drift and to protect the PCM layer 504. Specifically, the liner (not explicitly shown, but implied), when used, is preferably deposited after patterning the first and second conductive layers 502, 506 and PCM layer 504, such as by using atomic layer deposition (ALD). The liner, which is preferably disposed between the first and second conductive layers 502, 506 and the PCM layer 504, provides a parallel conduction path to the memory cell, which helps in mitigating the resistance drift. In one or more embodiments, the liner comprises a metal nitride layer (e.g., tantalum nitride (TaN), titanium nitride (TiN), tantalum silicon nitride (TaSiN), tantalum aluminum nitride (TaAlN), titanium aluminum nitride (TiAlN), titanium silicon nitride (TiSiN), etc.) and functions at least in part as a resistance drift stabilizer during operation of the memory, and to prevent phase change material from the PCM layer 504 from diffusing into the surrounding conductive layers 502, 506 during subsequent processing or during programming of the memory cell.

Figure 6A:
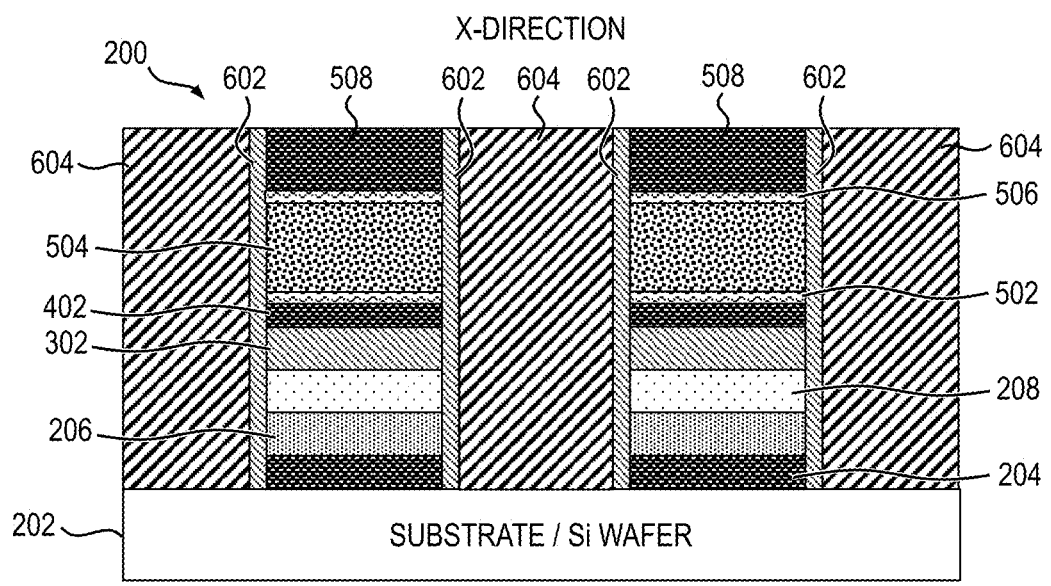
FIGS. 6A-6B are cross-sectional views depicting a first encapsulation step in the exemplary method of fabricating the stackable single-layer crosspoint memory array structure, according to an embodiment of the present invention.
Figure 6B:
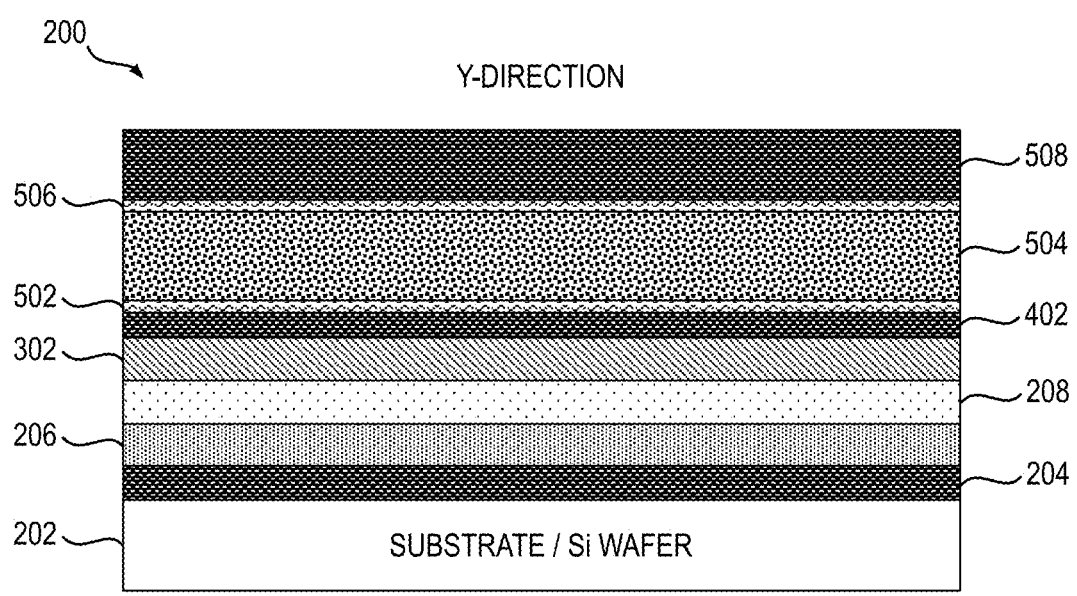

FIGS. 6A-6B are cross-sectional views depicting a first encapsulation step in the exemplary method of fabricating the stackable single-layer crosspoint memory array structure 200, according to an embodiment of the invention; FIG. 6A is a cross-sectional view of the memory array structure in the first direction (along line X-X' in FIG. 1A), and FIG. 6B is a cross-sectional view of the memory array structure in the second direction (along line Y-Y' in FIG. 1A), orthogonal to the first direction. With reference to FIG. 6A, an encapsulation layer 602 is deposited on at least sidewalls of the diode stacks (comprising first wiring layer 204, first doped silicon layer 206, optional intrinsic silicon layer 208, second doped silicon layer 302 and second wiring layer 402) and PCM memory region (comprising first and second conductive layers 506, 506 and PCM layer 504) using, for example, an ALD or PECVD process. The sidewall encapsulation layer 602, in one or more embodiments, is formed of a dielectric material, such as, for example, SiN, silicon oxide (SiO), silicon oxynitride (SiON), etc.

Next, a dielectric (i.e., insulating) layer 604 is deposited in the spaces between adjacent diode stacks, followed by CMP or etch-back to planarize an upper surface of the memory array structure 200. The dielectric layer 604 electrically isolates adjacent stack structures from one another and provides mechanical support to the overall crosspoint memory array structure 200. The dielectric layer 604 also provides a planar top surface for subsequent processing steps. Suitable materials for forming the dielectric layer 604 include, but are not limited to, SiN, SiO, SiNO. The memory array structure 200 shown in FIG. 6B, being viewed in cross-section along line Y-Y', will look essentially the same as the structure shown in FIG. 5B.

Figure 7A:
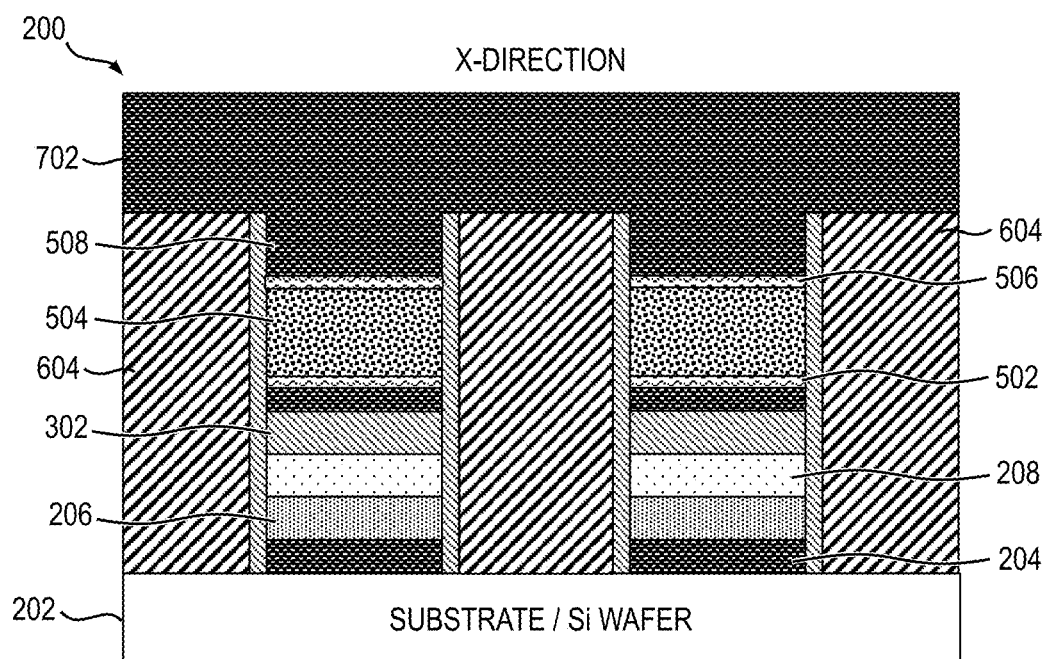
FIGS. 7A-7B are cross-sectional views depicting a first metal deposition step in the exemplary method of fabricating the stackable single-layer crosspoint memory array structure, according to an embodiment of the present invention.
Figure 7B:
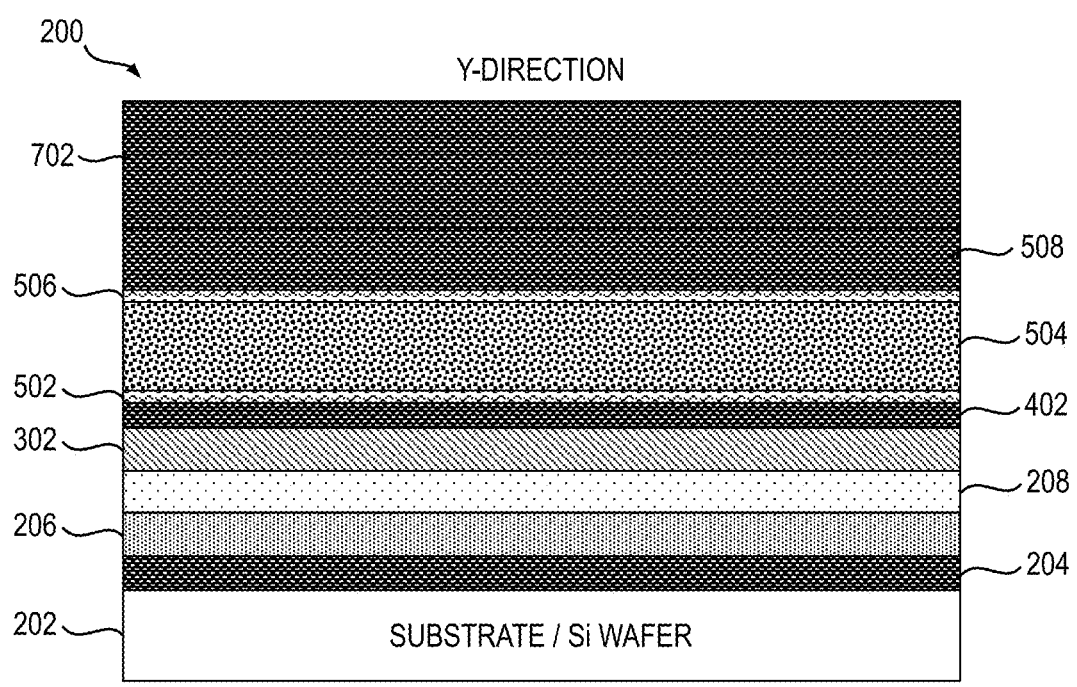

FIGS. 7A-7B are cross-sectional views depicting a metal deposition step in the exemplary method of fabricating the stackable single-layer crosspoint memory array structure 200, according to an embodiment of the invention; FIG. 7A is a cross-sectional view of the memory array structure in the first direction (along line X-X' in FIG. 1A), and FIG. 7B is a cross-sectional view of the memory array structure in the second direction (along line Y-Y' in FIG. 1A), orthogonal to the first direction. Specifically, after CMP or etch-back, a metal layer 702 is formed over at least a portion of an upper surface of the memory array structure 200. The metal layer 702 may be formed, in one or more embodiments, using a metal deposition process (e.g., tungsten (W), aluminium (Al), titanium tungsten (Ti/W)). A top electrode of each of the diode stacks shown in FIG. 7A, formed from the second wiring layer 402 (see FIG. 4A) are electrically connected together via the metal layer 702.

Figure 8A:
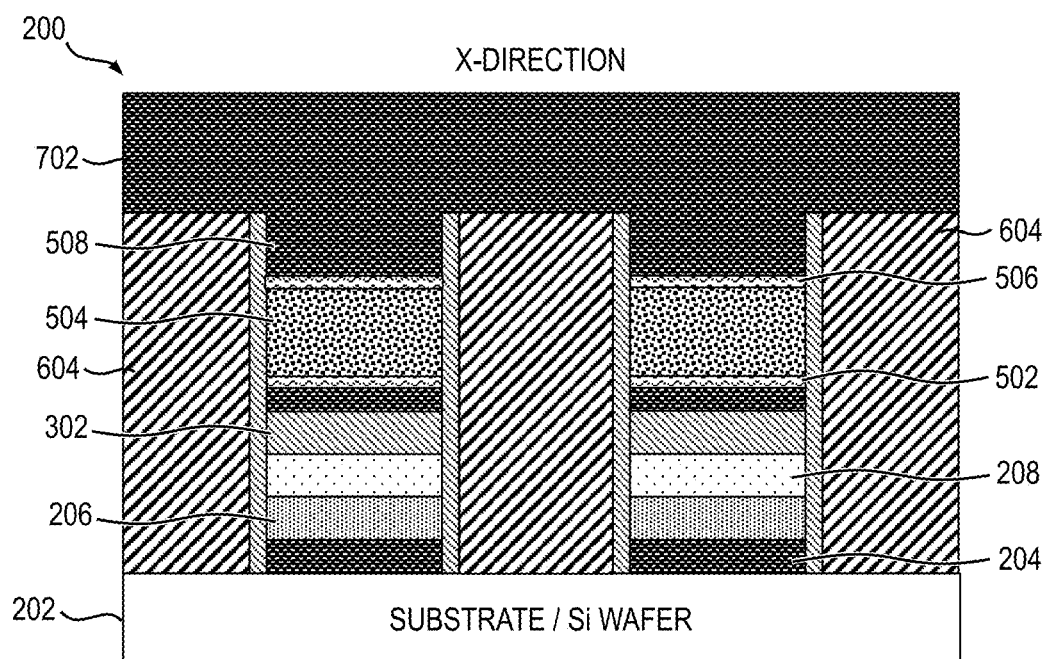
FIGS. 8A-8B are cross-sectional views depicting an exemplary patterning and etching process for forming a second set of lines (e.g., column or row lines), orthogonal to the first set of lines, in the stackable single-layer crosspoint memory array structure, according to an embodiment of the present invention.
Figure 8B:
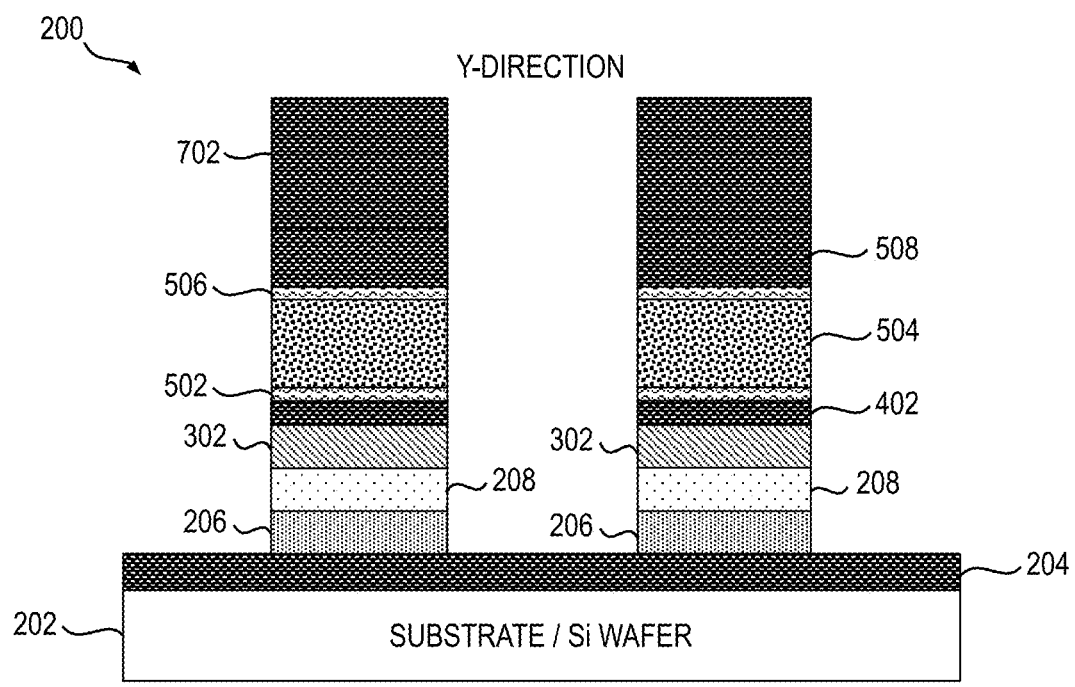

With reference now to FIGS. 8A-8B, an exemplary patterning and etching process is shown for forming a second set of lines (e.g., column or row lines), orthogonal to the first set of lines, in the stackable single-layer crosspoint memory array structure 200, according to an embodiment of the invention; FIG. 8A is a cross-sectional view of the memory array structure in the first direction (along line X-X' in FIG. 1A), and FIG. 8B is a cross-sectional view of the memory array structure in the second direction (along line Y-Y' in FIG. 1A), orthogonal to the first direction. As previously stated, during the patterning process, a photoresist layer is deposited over the surface of the wafer (e.g., by spin coating or the like). The wafer is then exposed to a pattern of intense light using a mask as part of a photolithographic process to transfer the desired mask pattern onto the wafer. The resulting patterned hard mask protects select portions of the wafer during subsequent etching.

During etching, the uppermost layer of the substrate is selectively removed in areas that are not protected by the patterned hard mask. FIG. 8B depicts at least a portion of the exemplary memory array structure 200, viewed along the y-direction, showing the resulting stack structure after etching. As stated in conjunction with FIGS. 5A-5B, optionally, in one or more embodiments, a metal liner and spacer may be formed after PCM patterning prior to etching the metal and remaining stack structure to mitigate resistance drift and to protect the PCM layer 504.

Figure 9A:
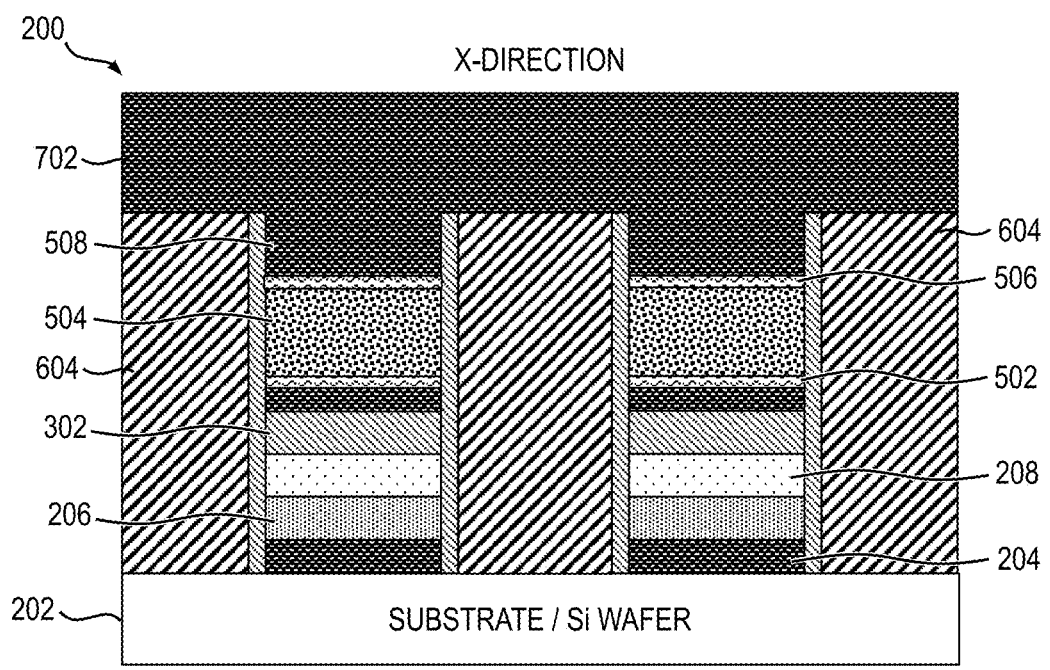
FIGS. 9A-9B are cross-sectional views depicting a second encapsulation step in the exemplary method of fabricating the stackable single-layer crosspoint memory array structure, according to an embodiment of the present invention.
Figure 9B:
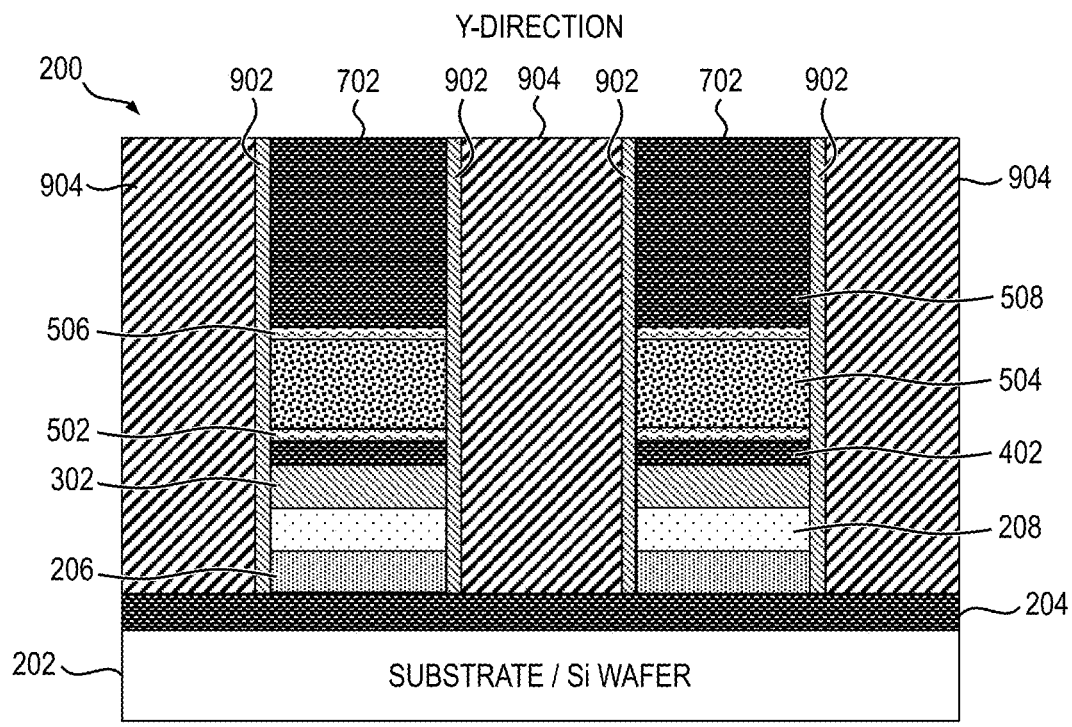

In a manner consistent with the processing shown in FIG. 6A, FIGS. 9A-9B are cross-sectional views depicting a second encapsulation step in the exemplary method of fabricating the stackable single-layer crosspoint memory array structure 200, according to an embodiment of the invention; FIG. 9A is a cross-sectional view of the memory array structure in the first direction (along line X-X' in FIG. 1A), and FIG. 9B is a cross-sectional view of the memory array structure in the second direction (along line Y-Y' in FIG. 1A), orthogonal to the first direction. With reference to FIG. 9B, an encapsulation layer 902 is deposited on at least sidewalls of the diode stacks (comprising first doped silicon layer 206, optional intrinsic silicon layer 208, second doped silicon layer 302 and metal layer 402) using, for example, an ALD or PECVD process.

A dielectric (i.e., insulating) layer 904 is then deposited in the spaces between adjacent diode stacks, followed by CMP or etch-back to planarize an upper surface of the memory array structure 200. The dielectric layer 904, like dielectric layer 604 in FIG. 6A, electrically isolates adjacent stack structures and provides mechanical support to the overall crosspoint memory array structure 200. The dielectric layer 904 further provides a planar top surface of the structure. Suitable materials for forming the dielectric layer 904 include, but are not limited to, SiN, SiO, SiON. The resulting structure 200 is shown in FIGS. 9A-9B in the context of illustrative PIN diode access devices. Optionally, in one or more embodiments, a metal liner and spacer may be formed after PCM patterning prior to etching the metal and remaining stack structure to mitigate resistance drift and to protect the PCM layer (not explicitly shown, but implied).

Figure 10A:
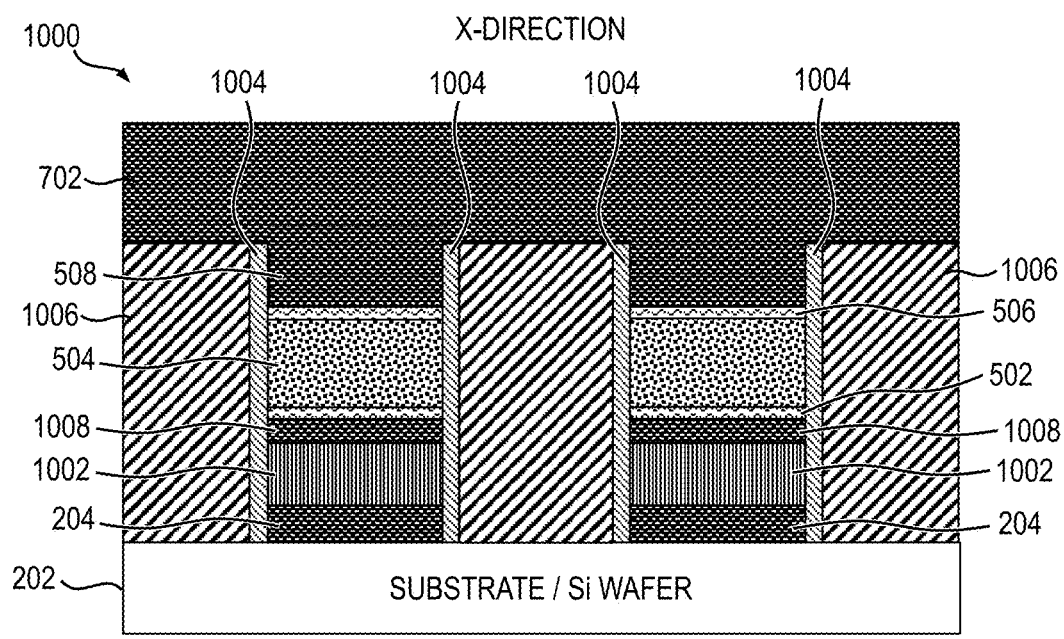
FIGS. 10A-10B are cross-sectional views depicting the stackable single-layer crosspoint memory array structure using Schottky diodes as access devices in the memory array structure, according to an embodiment of the present invention.
Figure 10B:
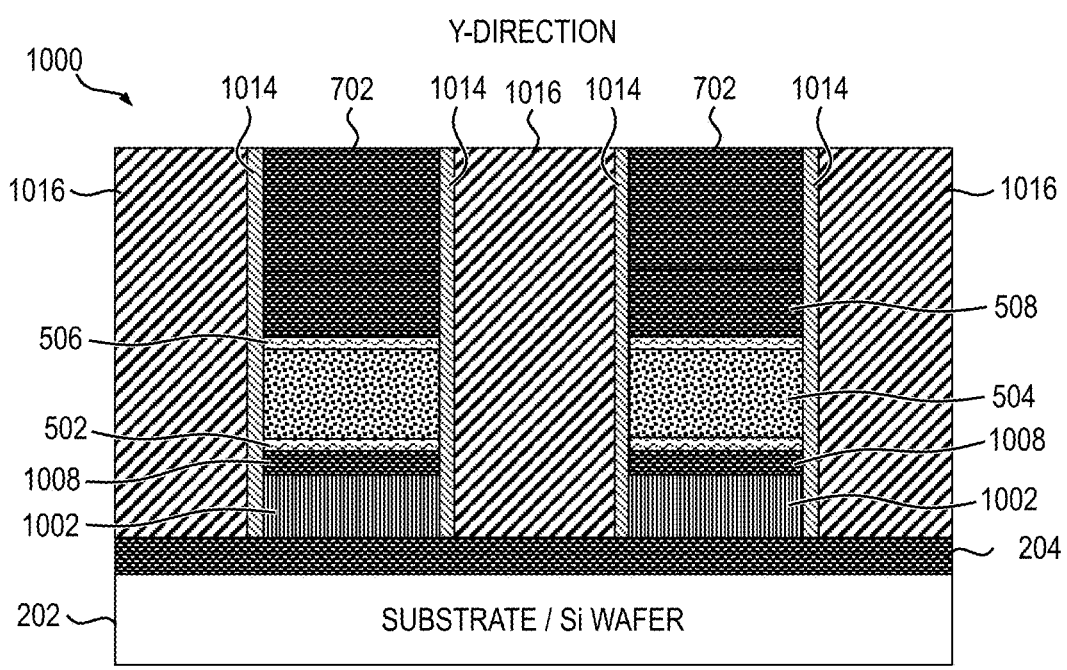

FIGS. 10A-10B are cross-sectional views depicting a stackable single-layer crosspoint memory array structure 1000 using Schottky diodes as access devices in the memory array, according to an embodiment of the invention; FIG. 10A is a cross-sectional view of the memory array structure in the first direction (along line X-X' in FIG. 1A), and FIG. 10B is a cross-sectional view of the memory array structure in the second direction (along line Y-Y' in FIG. 1A), orthogonal to the first direction. Fabrication of the crosspoint memory structure 1000 with Schottky diode access devices preferably proceeds in essentially the same manner as for the crosspoint memory structure 200 with PN or PIN diode access devices, except for the missing doped silicon layers (206 and 302 in FIG. 3A) and intrinsic silicon layer (208 in FIG. 3A), in one or more embodiments.

Specifically, with reference to FIGS. 10A-10B, each of the Schottky diode stacks is formed on the first wiring layer 204 and includes a semiconductor layer 1002, which may be N-doped silicon, for example, formed on the first wiring layer. A metal layer 1008 is then deposited on the semiconductor layer 1002. A memory region is formed on the metal layer 1008, preferably in a manner consistent with the formation of the memory region previously described in conjunction with FIGS. 5A-5B. The memory region, in one or more embodiments, comprises the first conductive layer 502 formed on at least a portion of an upper surface of the metal layer 1008, a layer of phase change material 504 formed on at least a portion of an upper surface of the first conductive layer 502, and a second conductive layer 506 formed on at least a portion of an upper surface of the PCM layer 504. A top electrode layer 508 is then formed on at least a portion of an upper surface of the second conductive layer 506. The top electrode 508 is preferably of sufficient cross-sectional thickness to be used as a hard mask for subsequent processing. After patterning the first line, all top electrodes are electrically connected together through a layer of metal (e.g., 702 shown in FIG. 7), as previously described.

The memory array structure 1000 is subjected to a first patterning and etching processes, consistent with the patterning and etching depicted in FIG. 5A, in one or more embodiments. During patterning, a photoresist layer deposited over the surface of the wafer is exposed, during photolithographic processing, to a pattern of intense light to transfer a desired mask pattern onto the wafer. The resulting pattern is used to form a hard mask, which is adapted to protect select portions of the wafer during subsequent etching. During etching, the uppermost layer of the substrate is selectively removed in areas that are not protected by the patterned hard mask.

An encapsulation step is then performed to deposit a thin encapsulation layer 1004 on at least sidewalls of the diode stacks, and then the spacers between adjacent diode stacks are filled in with a dielectric layer 1006, in a manner consistent with the encapsulation process described in conjunction with FIGS. 6A-6B. After CMP or etch-back, a metal layer 702 is deposited on at least a portion of an upper surface of the exemplary memory array structure 1000, with resulting stack structure shown in FIG. 10A viewed in the x-direction.

Similarly, with reference to FIG. 10B, the memory array structure 1000 is subjected to a second patterning and etching processes in a direction orthogonal to the patterning and etching process performed in FIG. 10A, consistent with the patterning and etching process depicted in FIG. 8B, in one or more embodiments. A second encapsulation layer 1014 is formed on at least sidewalls of the resulting diode stacks, and a second dielectric layer 1016 is deposited to fill in spaces between the adjacent diode stacks. The resulting structure 1000, viewed in the y-direction, is shown in FIG. 10B after performing CMP or etch-back to planarize the upper surface of the structure. Optionally, in one or more embodiments, a metal liner and spacer may be formed after PCM patterning prior to etching the metal and remaining stack structure to mitigate resistance drift and to protect the PCM layer (not explicitly shown, but implied).

It is to be understood that although the illustrative memory array structures shown in the figures and described herein include a PCM memory element, one or more embodiments of the invention may be directed to forming a vertical diode only (e.g., PN, PIN or Schottky diode), without need for a memory element. In such embodiments, steps relating to the formation of the memory region (e.g., including first and second conductive layers 502, 506, and PCM layer 504) may be omitted.

Figure 11A:
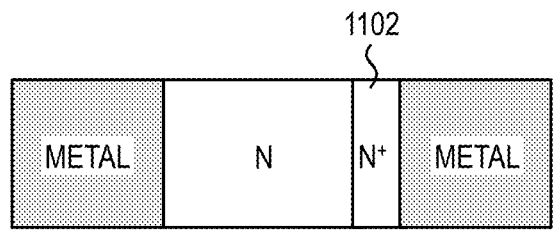
FIGS. 11A-11B conceptually depict exemplary doping profiles of N-type and P-type drift regions, respectively, in the diode stacks, according to an embodiment of the present invention.
Figure 11A:
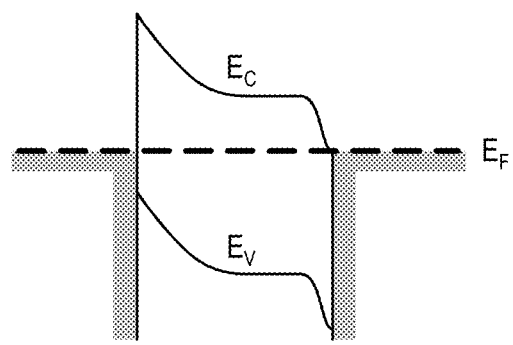
Figure 11B:
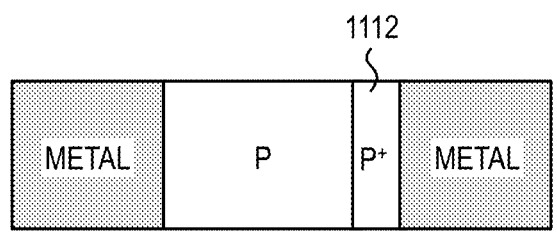
Figure 11B:
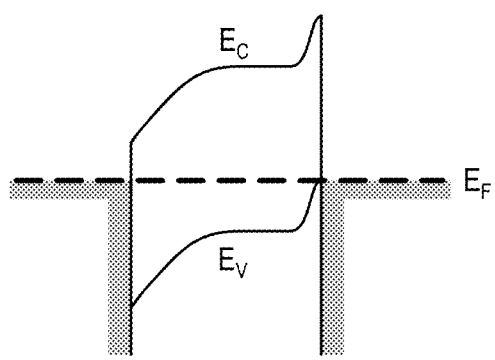

Turning now to FIGS. 11A-11B, exemplary dopant profiles suitable for use with the diode stacks of the memory array structures are conceptually depicted, according to an embodiment of the invention. In the examples shown in FIGS. 11A-11B, an N-type drift region 1102 and P-type drift region 1112 in the diode access device is partially depleted, in one or more embodiments. In other embodiments, the drift regions 1102, 1112 may have lower doping and/or narrower widths, and may therefore be fully depleted (i.e., form narrow base diodes).

Given the discussion thus far, it will be appreciated that, in general terms, an exemplary method of fabricating an access device in a crosspoint memory array structure during BEOL processing includes: forming at least a first doped semiconductor layer on an upper surface of a first conductive layer, the first doped semiconductor layer being in electrical connection with the first conductive layer; exposing at least a portion of the first doped semiconductor layer to a directed energy source to cause localized annealing in the first doped semiconductor layer for activating a dopant of a first conductivity type in the first doped semiconductor layer, thereby converting at least a portion of the first doped semiconductor layer into a polycrystalline layer; forming a second conductive layer over a least a portion of the first doped semiconductor layer; and etching the first doped semiconductor layer and the first and second conductive layers to form an access device that is self-aligned with the first and second conductive layers.

Given the discussion thus far, it will be appreciated that, in general terms, an exemplary method of fabricating a memory cell for use in a crosspoint memory array includes forming an access device during BEOL processing of the crosspoint memory array, the access device being formed by: forming at least a first doped semiconductor layer on an upper surface of a first conductive layer, the first doped semiconductor layer being in electrical connection with the first conductive layer; exposing at least a portion of the first doped semiconductor layer to a directed energy source, the directed energy source causing localized annealing in the first doped semiconductor layer to activate a dopant of a first conductivity type in the first doped semiconductor layer, thereby converting at least a portion of the first doped semiconductor layer into a polycrystalline layer; forming a second conductive layer over a least a portion of the first doped semiconductor layer; and etching the first doped semiconductor layer and the first and second conductive layers to form an access device that is self-aligned with the first and second conductive layers. The method further includes forming a storage element on at least a portion of the access device and in electrical connection with the access device, the storage element being self-aligned with the access device.

At least a portion of the structures and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having classification circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Reference made throughout this specification to "one embodiment" or "an embodiment" is intended to mean that a particular feature, structure, or characteristic described in connection with the embodiment is included in at least one embodiment of the claimed subject matter. It is to be understood that appearances of the phrase "in one embodiment" or "an embodiment" are not necessarily all referring to the same embodiment. Furthermore, embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it is to be appreciated that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating an access device in a crosspoint memory array structure during back end of line (BEOL) processing of the crosspoint memory array structure, the method comprising:
    forming at least a first doped semiconductor layer on an upper surface of a first conductive layer, the first doped semiconductor layer being in electrical connection with the first conductive layer;
    exposing at least a portion of the first doped semiconductor layer to a directed energy source, the directed energy source causing localized annealing in the first doped semiconductor layer to activate a dopant of a first conductivity type in the first doped semiconductor layer and to convert at least a portion of the first doped semiconductor layer into a first polycrystalline layer;
    subsequent to exposing at least a portion of the first doped semiconductor layer to the directed energy source, forming a second doped semiconductor layer on at least a portion of an upper surface of the first polycrystalline layer;
    exposing at least a portion of the second doped semiconductor layer to the directed energy source, the directed energy source causing localized annealing in the second doped semiconductor layer to thereby activate a dopant of a second conductivity type, opposite the first conductivity type, in the second doped semiconductor layer and to convert at least a portion of the second doped semiconductor layer into a second polycrystalline layer;
    forming a second conductive layer over a least a portion of the first and second doped semiconductor layers; and
    etching the first and second doped semiconductor layers and the first and second conductive layers using a same mask pattern to form an access device that is self-aligned with the first and second conductive layers.

2. The method of claim 1, wherein forming the first doped semiconductor layer is performed using in situ deposition.

3. The method of claim 2, wherein the in situ deposition for forming the first doped semiconductor layer comprises one of physical vapor deposition (PVD) and plasma-enhanced chemical vapor deposition (PECVD).

4. The method of claim 1, wherein forming the second doped semiconductor layer is performed using in situ deposition.

5. The method of claim 1, wherein exposing at least a portion of the first and second doped semiconductor layers to the directed energy source comprises performing excimer laser annealing on respective prescribed regions in the first and second doped semiconductor layers.

6. The method of claim 1, wherein forming the first and second doped semiconductor layers comprises depositing, using physical vapor deposition (PVD) sputtering, N-doped silicon and P-doped silicon.

7. The method of claim 1, wherein depositing the respective first and second doped semiconductor layers comprises one of PVD co-sputtering and PVD sputtering each of the first and second doped semiconductor layers from a single target.

8. The method of claim 1, further comprising forming an intrinsic semiconductor layer between the first and second doped semiconductor layers.

9. The method of claim 8, wherein forming the intrinsic semiconductor layer comprises PVD sputtering from an intrinsic silicon target.

10. The method of claim 1, wherein exposing at least a portion of the first doped semiconductor layer to the directed energy source comprises performing excimer laser annealing on a prescribed region in the first doped semiconductor layer.

11. The method of claim 1, wherein forming the first doped semiconductor layer comprises depositing, using PVD sputtering, one of N-doped silicon and P-doped silicon.

12. The method of claim 11, wherein depositing one of N-doped silicon and P-doped silicon comprises PVD sputtering from a doped silicon target.

13. The method of claim 1, further comprising forming an encapsulation layer on at least sidewalls of the access device.

14. A method of fabricating a memory cell for use in a crosspoint memory array, the method comprising:
    forming an access device during back end of line (BEOL) processing of the crosspoint memory array, wherein forming the access device comprises:
        forming at least a first doped semiconductor layer on an upper surface of a first conductive layer, the first doped semiconductor layer being in electrical connection with the first conductive layer;
        exposing at least a portion of the first doped semiconductor layer to a directed energy source, the directed energy source causing localized annealing in the first doped semiconductor layer to activate a dopant of a first conductivity type in the first doped semiconductor layer and to convert at least a portion of the first doped semiconductor layer into a first polycrystalline layer;
        subsequent to exposing at least a portion of the first doped semiconductor layer to the directed energy source, forming a second doped semiconductor layer on at least a portion of an upper surface of the first polycrystalline layer;

exposing at least a portion of the second doped semiconductor layer to the directed energy source, the directed energy source causing localized annealing in the second doped semiconductor layer to thereby activate a dopant of a second conductivity type, opposite the first conductivity type, in the second doped semiconductor layer and to convert at least a portion of the second doped semiconductor layer into a second polycrystalline layer;

forming a second conductive layer over a least a portion of the first and second doped semiconductor layers; and etching the first and second doped semiconductor layers and the first and second conductive layers using a same mask pattern to form an access device that is self-aligned with first and second conductive layers; and forming a storage element on at least a portion of the access device and in electrical connection with the access device, the storage element being self-aligned with the access device.

15. The method of claim 14, wherein forming the storage element comprises:

forming a third conductive layer on at least a portion of an upper surface of the second conductive layer;

forming a phase change material layer on at least a portion of an upper surface of the third conductive layer; and forming a fourth conductive layer on at least a portion of an upper surface of the phase change material layer.

16. The method of claim 15, wherein forming the storage element further comprises patterning and etching the third and fourth conductive layers and the phase change material layer concurrently with patterning and etching of the first doped semiconductor layer and the first and second conductive layers so that the access device is self-aligned with the storage element.

17. The method of claim 14, further comprising forming an encapsulation layer on at least sidewalls of the access device and storage element.

18. The method of claim 14, wherein forming the first doped semiconductor layer is performed using in situ deposition.

19. The method of claim 1, wherein exposing at least a portion of the second doped semiconductor layer to the directed energy source is performed with the directed energy source at a lower energy level compared to exposing at least a portion of the first doped semiconductor layer to the directed energy source.

20. The method of claim 8, further comprising exposing at least a portion of the intrinsic semiconductor layer to the directed energy source separately from exposing the first doped semiconductor layer to the directed energy source.

* * * * *